(12) United States Patent
Dauksher et al.

(10) Patent No.: US 6,320,754 B1
(45) Date of Patent: Nov. 20, 2001

(54) APPARATUS FOR THE REDUCTION OF INTERFACIAL STRESS CAUSED BY DIFFERENTIAL THERMAL EXPANSION IN AN INTEGRATED CIRCUIT PACKAGE

(75) Inventors: Walter J Dauksher; Pedro F Engel, both of Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/369,898

(22) Filed: Aug. 6, 1999

(51) Int. Cl.[7] ........................................ H05K 1/18
(52) U.S. Cl. ..................... 361/760; 361/765; 361/807; 361/809; 257/737; 257/738; 257/788; 257/789; 174/255
(58) Field of Search ..................... 361/760, 765, 361/796, 801, 807, 809, 741; 257/667, 737, 738, 782, 783, 788, 789; 174/250, 255, 258

(56) References Cited

U.S. PATENT DOCUMENTS

| 4,437,718 | * | 3/1984 | Selinko ........................... 439/591 |
|---|---|---|---|
| 5,455,387 | * | 10/1995 | Hoffman et al. ............... 174/52.4 |
| 5,570,274 | * | 10/1996 | Saito et al. ....................... 361/784 |
| 5,844,319 | * | 12/1998 | Gamota et al. ................. 257/778 |
| 5,868,887 |   | 9/1999 | Sylvester et al. ............... 156/150 |
| 5,892,289 | * | 4/1999 | Tokuno .............................. 257/783 |
| 5,909,057 | * | 6/1999 | McCormick et al. .......... 257/704 |
| 5,936,304 |   | 8/1999 | Lii et al. .......................... 257/701 |
| 5,973,404 | * | 10/1999 | Akram et al. ................... 257/778 |
| 6,011,304 | * | 1/2000 | Mertol ............................. 257/706 |
| 6,081,416 | * | 6/2000 | Trinh et al. ..................... 361/308.1 |

FOREIGN PATENT DOCUMENTS

| 0452752 A2 | 4/1991 | (EP) | ............... H01L/23/66 |
| 2276977 A | 10/1994 | (GB) | ............... H01L/23/12 |

* cited by examiner

Primary Examiner—Leo P. Picard
Assistant Examiner—David Foster
(74) Attorney, Agent, or Firm—Steven L. Webb

(57) ABSTRACT

A device that reduces the interfacial stress caused by differential thermal expansion in an IC/PC board assembly can be created by attaching an annular part, that has a higher coefficient of thermal expansion, to the IC at an elevated temperature. When the assembly cools the annular part contracts and compresses the IC, increasing the change in size of the IC and reducing the stress in the IC/PC joint.

24 Claims, 7 Drawing Sheets

APPARATUS FOR THE REDUCTION OF INTERFACIAL STRESS CAUSED BY DIFFERENTIAL THERMAL EXPANSION IN AN INTEGRATED CIRCUIT PACKAGE

FIELD OF THE INVENTION

The present invention relates generally to integrated circuits and more particularly to an integrated circuit assembly that reduces interfacial stress caused by differential thermal expansion.

BACKGROUND OF THE INVENTION

Integrated circuits (IC) are typically mounted onto printed circuit (PC) boards for use. In one implementation, called direct chip attach, the IC is attached directly on the PC board. Another common form mounts the IC on a substrate. Subsequently, a lid, encapsulant or heat sink may be applied over the IC/substrate combination. The IC and substrate assembly are typically called an IC package. For simplicity, the IC package will be discussed without reference to the lid, encapsulant or heat sink. The IC package is then attached onto a PC board for use. IC's and IC packages are typically attached to the PC board using solder. The solder makes the electrical connection between the IC/IC package and the PC board as well as the mechanical connection between the IC/IC package and the PC board. For the direct chip attach method the solder is typically referred to as solder bumps and for ball grid array packages the solder is typically in the form of solder balls. During the soldering process the IC/IC package, the PC board, and the solder are heated until the solder melts. When the solder cools below its freezing point the solder forms a bond between the IC/IC package and the PC board. Once the bond is complete the assembly is cooled to room or operating temperature.

Because the IC and some of the IC packages and the PC board are made of different materials that have different coefficients of thermal expansion, the change in length for a given change in temperature is different between the IC/IC package and the PC board. The substrate in an IC package may have a different coefficient of thermal expansion than the PC board. The PC board typically has a higher coefficient of thermal expansion than the IC, causing a greater length change for a given temperature change. For example, when the solder (106) freezes at a temperature of around 183 degrees C., the joint between the IC (102) and the PC board (104) is stress free (see FIG. 1a). For clarity, FIG. 1a only shows two solder bumps attaching the IC to the PC board, however, in practice there will be a plurality of solder bumps. As the assembly continues to cool, the IC changes in length at a slower rate than the PC board does. This difference in the shrink rate between the IC and the PC board induces stress into the solder bumps joining the assembly as well as induces stress into both the PC board and the IC. The stress in the assembly can cause warping of the PC board (see FIG. 2), shearing of the solder bumps, crack propagation, delamination of the PC board, and other undesirable effects. These problems typically occur in both the direct chip attach IC (see FIG. 1a) and the IC package attached to a PC board (see FIG. 1b). FIG. 2 shows an exaggeration of the distortion in the IC and the PC board for illustration purposes only; the actual distortion would not typically be visible to the unaided eye. Even when the stress does not cause an immediate failure it may reduce the life of the assembly through fatigue. Fatigue is caused by differential expansion of the solder joint due to the change in temperature of the IC or IC package, the PC board and the environment during normal operation.

One partial solution to these problems is to fill the gaps between the IC and the PC board or the gap between the IC and substrate with an epoxy or other non-conductive material. The addition of epoxy or other materials is typically called underfill. Underfill merely provides an additional load-carrying component. By carrying part of the load, the underfill (302) reduces the load in the solder balls (304) and spreads the stress in the IC (306) and PC board or substrate (308) across the surface of the interface (see FIG. 3). Unfortunately the underfill is susceptible to delamination from the IC, substrate and/or the PC board surfaces. Applying underfill must be done at elevated temperatures and causes an additional step in the manufacturing process. Underfill can be used in the joint between an IC and PC board, in the direct chip attach method, as well as the joint between the substrate and the IC in an IC package assembly.

Accordingly, there is a need for reduced stress in the joint between an IC and a PC board. There is a need for an assembly that reduces stress in the joint between an IC and a substrate. Finally there is a need for an assembly that reduces stress in the joint between a substrate and a PC board

SUMMARY OF THE INVENTION

A device that reduces the interfacial stress caused by differential thermal expansion in an IC/PC board assembly is created by attaching an annular part, that has a higher coefficient of thermal expansion, to the IC at an elevated temperature. When the assembly cools the annular part contracts and compresses the IC, thus increasing the change in size of the IC and thereby reducing the stress in the IC/PC joint. The same type of device can be used for an IC package to PC board assembly wherein the annular part is applied to the IC substrate.

DETAILED DESCRIPTION OF THE PREFERRED EMBODIMENT

Figure 1A:
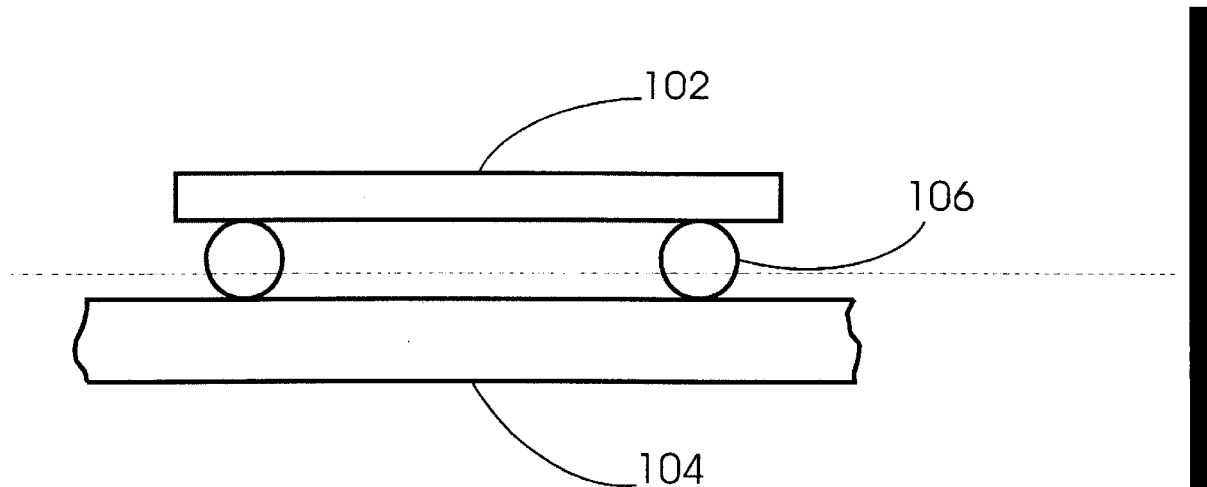
FIG. 1a is a side view of an IC attached to a PC board at the stress free temperature.
Figure 1B:
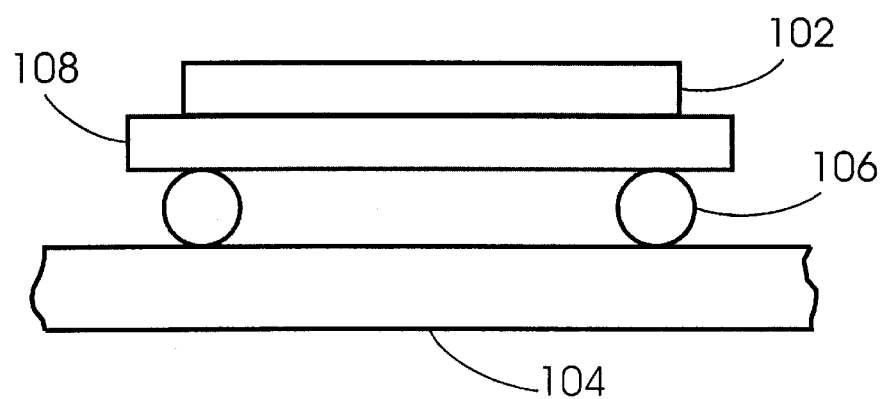
FIG. 1b is a side view of an IC package attached to a PC board at the stress free temperature.
Figure 2:
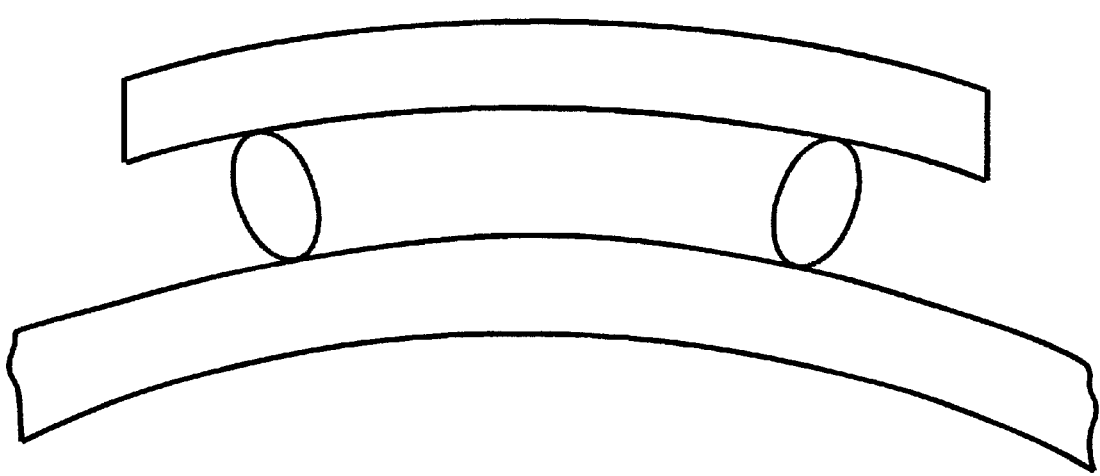
FIG. 2 is a side view of an IC attached to a PC board at room temperature.
Figure 3:
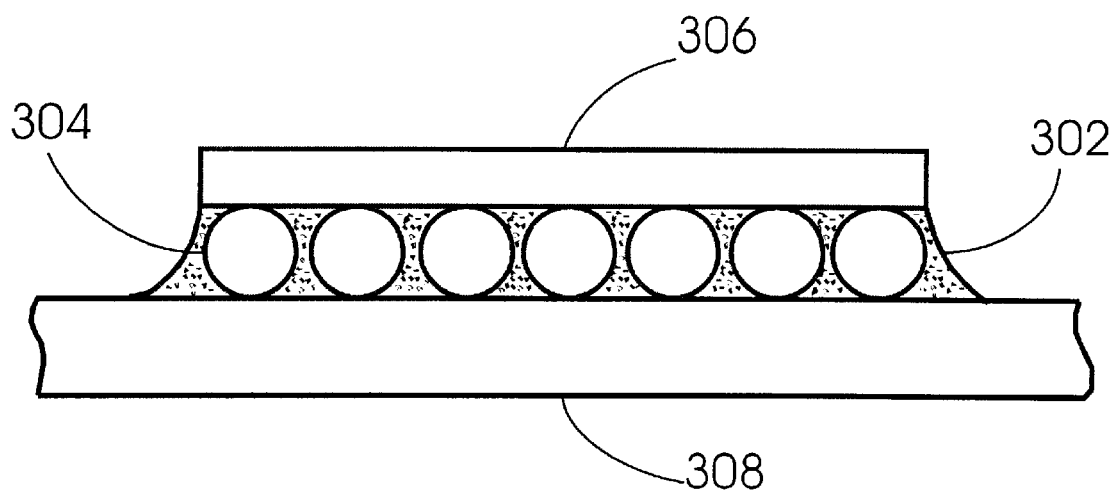
FIG. 3 is a side view of an IC attached to a PC board with underfill.
Figure 4:
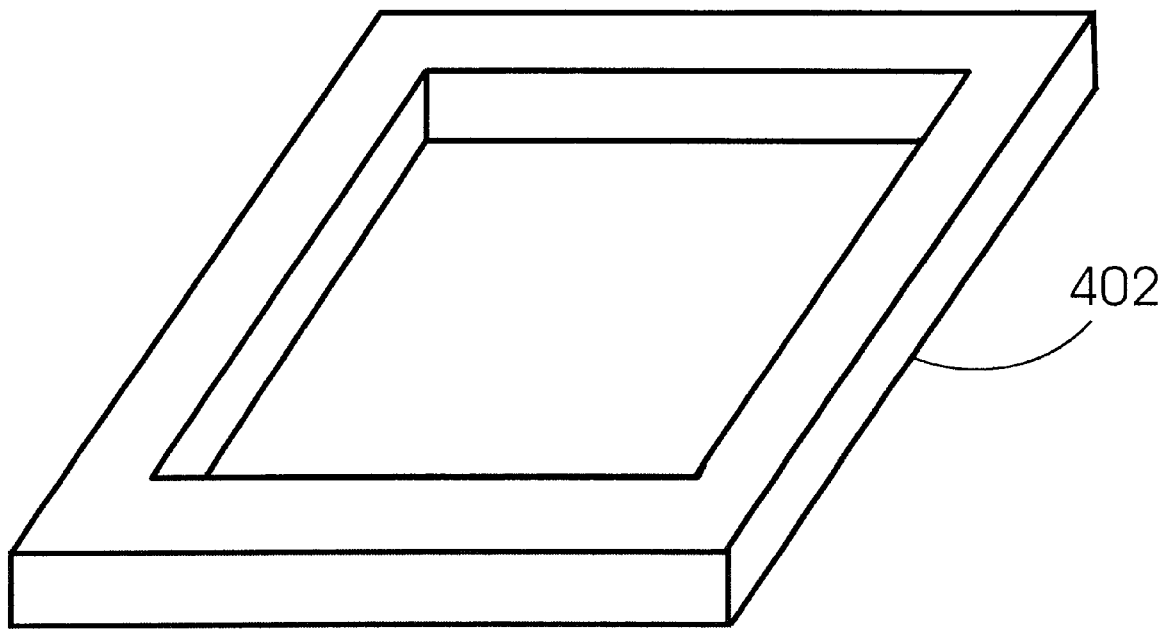
FIG. 4 is a perspective view of an annular ring in accordance with the present invention.
Figure 5A:
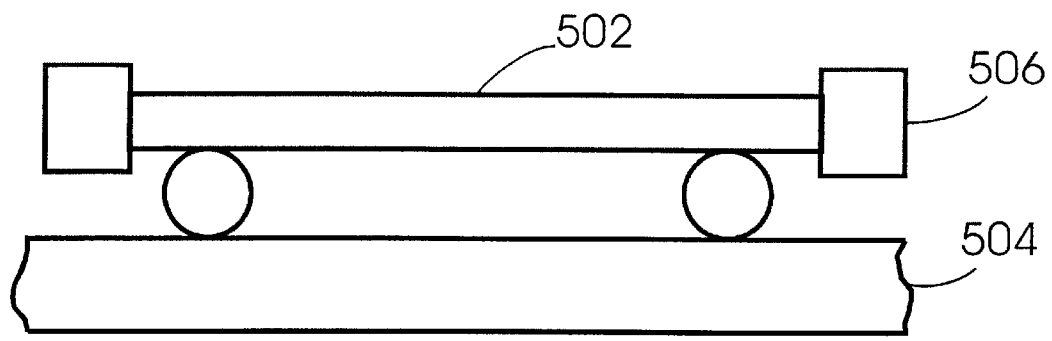
FIG. 5a is a section view of the IC/PC board assembly with the annular ring attached to the IC in accordance with the present invention.
Figure 5B:
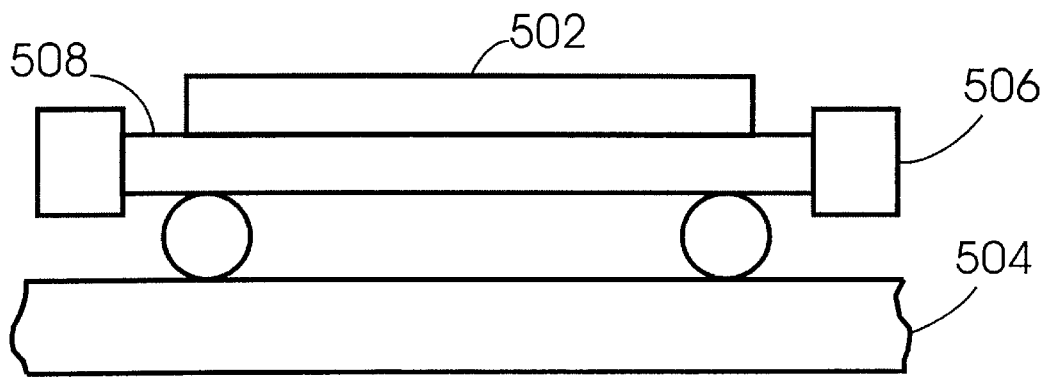
FIG. 5b is a section view of the IC package/PC board assembly with the annular ring attached to the substrate in accordance with the present invention.

Adding a ring or annular part that compresses the IC in an IC/PC board assembly or that compresses the substrate in an IC package/PC board assembly can increase the expected life of the solder joint in the assembly by a factor of 2 or more. When used with an IC (502) that is directly attached to the PC board (504), the ring (506) surrounds the IC (502) (see FIG. 5a). When used with an IC (502) in an IC package, the ring (506) surrounds the substrate (508) in the IC package (see FIG. 5b). FIG. 4 shows an example embodiment of an annular ring. As one skilled in the art would understand, the annular part can be circular, square, or any other shape, as long as the opening in the annular part completely surrounds the outer perimeter of the IC or substrate. The ring is made of a material that has a higher coefficient of thermal expansion than the IC, or substrate, that the ring will surround.

In one embodiment, the ring (506) is constructed such that at an elevated temperature the IC (502) (see FIG. 5a) or substrate (508) (see FIG. 5b) just fits inside the inner diameter of the ring. In a second embodiment (not shown), the ring has a gap between the IC or substrate and the inner diameter of the ring at the elevated temperature. This gap is filled with an apoxy or other material, at the elevated temperature, to create a solid contact between the ring and the IC or substrate. The gap allows a larger tolerance for the inner diameter of the ring during the manufacturing process.

At the elevated temperature, the assembly of the ring and the IC or substrate fit together without any stress. Because the ring has a higher coefficient of thermal expansion than the IC or substrate that it surrounds, the ring will shrink at a faster rate than the IC or substrate for a given temperature change. At room or operating temperature, the ring has compressed the IC or substrate that it surrounds and forced the IC or substrate to change its length more than it would have without the ring attached. By changing the length of the IC or substrate more than it would have without the ring attached for the same temperature change, the change in length of the IC or substrate more closely matches the change in length of the PC board that it is attached to. Because the IC or substrate length change with the ring attached is closer to the PC board length change there is less stress in the solder that forms the joint between the IC or substrate and the PC board, and there is less stress in the PC board.

The elevated temperature where the ring is assembled to the IC or substrate can be the same temperature used in the soldering process or it can be another temperature.

Take for example a 40×40×2 mm $Al_2O_3$ substrate surrounded by an aluminum ring. The ring has a cross section of 7.5×7.5 mm. The substrate is attached to a PC board with 0.9 mm solder balls and subjected to a −200 degree C. temperature change. The solder ball joint would have an expected increase in life of 2.06 over the same joint without the ring. A 200-degree C. temperature change typically corresponds to a standard environmental qualification test. The $Al_2O_3$ substrate has a coefficient of thermal expansion of 6 ppm/° C. and a modulus of elasticity of 270×10$^9$ Pa. The aluminum ring has a coefficient of thermal expansion of 23.4 ppm/° C. and a modulus of elasticity of 70×10$^9$ Pa. The PC board has a coefficient of thermal expansion of 17.6 ppm/° C.

Figure 6:
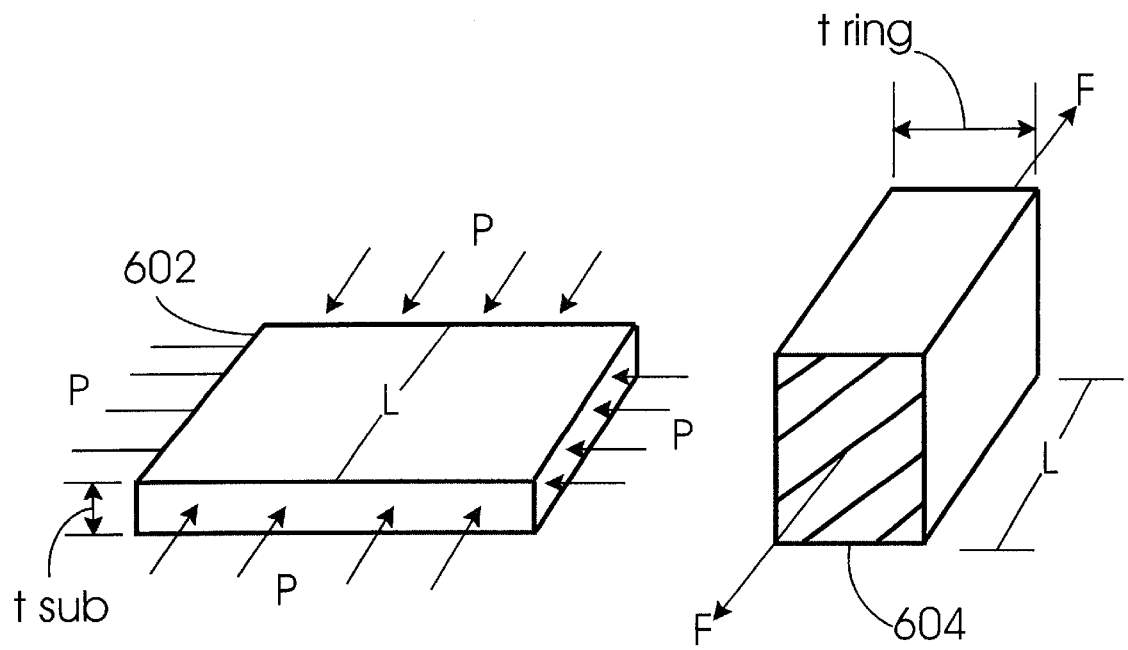
FIG. 6 is a force diagram of the example $Al_2O_3$ substrate and the ring segment.

Stress is defined as a force per unit area and strain is defined as the deformation per unit length. The strain in the example $AL_2O_3$ substrate is given by equation 1.

$$\epsilon_x = \left(\frac{\sigma_x}{E_s} - v_s \frac{\sigma_y}{E_s}\right) + \alpha_s \Delta T. \quad \text{Equation 1}$$

Where $E_s$ is the modulus of elasticity in compression of the substrate material, $\sigma_x$ and $\sigma_y$ are the stresses in the x and y directions, $v_s$ is the Poisson's ratio, $\alpha_s$ is the coefficient of thermal expansion of the substrate material and $\Delta T$ is the change in temperature. X and Y are orthogonal and lie in the plain of the substrate. Because the substrate is a square and the annular ring is symmetrical the stress in the x and y directions are equal and will be represented by a single variable $\sigma_x = \sigma_y = -P$. Equation 2 gives the total deformation of the substrate.

$$\delta = \epsilon_x L \quad \text{Equation 2.}$$

Where L is the length of the substrate 602 (see FIG. 6), δ is the deformation of the substrate and ϵ is the strain in the substrate in the x direction. Combining equation 1 and equation 2 and substituting −P for the stress in the x and y direction gives equation 3 for the deformation of the substrate in the x direction.

$$\delta = \frac{-PL}{E_s}(1 - v_s) + \alpha_s \Delta TL. \quad \text{Equation 3}$$

Figure 7:
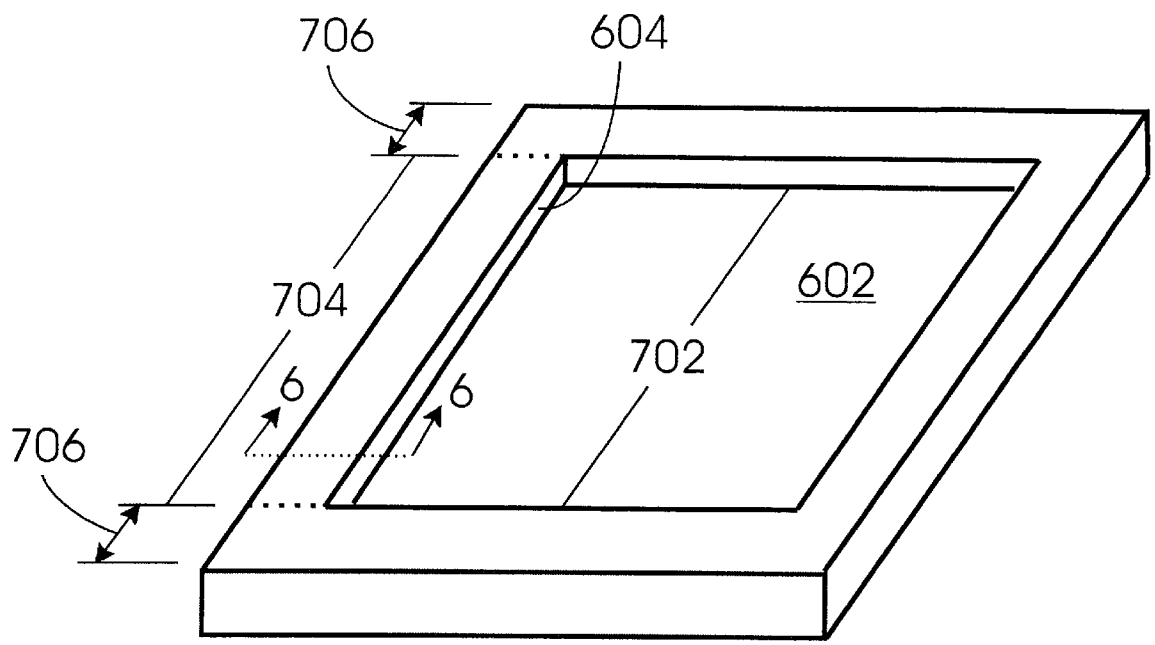
FIG. 7 is a perspective view of a substrate with an annular ring attached thereto in accordance with the present invention.

Equation 4 gives the deformation of the aluminum ring along one segment of its length. For analysis, the length 702 of the substrate 602 is assumed equal to the length 704 of the ring segment 604 and the corners of the ring 706 are not included (see FIG. 7).

$$\delta = \frac{FL}{A_r E_r} + \alpha_r \Delta TL. \quad \text{Equation 4}$$

Where F is the force along the length of one segment 604 of the ring (see FIG. 6), L is the length of the segment of the ring, $A_r$ is the area of the segment of the ring, $E_r$ is the modulus of elasticity of the material of the ring, $\alpha_r$ is the coefficient of thermal expansion of the ring material and $\Delta T$ is the change in temperature. Equation 5 relates the force in the ring segment to the force per unit area (stress) in the $Al_2O_3$ substrate. Because there are two ring segments in any section cut, the force in each ring segment is equal to ½ the force in the $Al_2O_3$ substrate.

$$F = \frac{P t_s L}{2}. \quad \text{Equation 5}$$

Where F is the force in the ring, P is the stress in the substrate, $t_s$ is the thickness of the substrate and L is the length of the substrate. Again for analysis the length of the substrate is assumed equal to the length of the ring section. Equation 6 is a combination of equations 4 and 5 and gives the total deformation of the ring segment.

$$\delta = \frac{P t_s L^2}{2 A_r E_r} + \alpha_r \Delta TL. \quad \text{Equation 6}$$

Because the annular ring is in physical contact with the $Al_2O_3$ substrate the deformation of the ring segment is equal to the deformation of the $Al_2O_3$ substrate. Therefore the deformation of the ring segment in equation 6 can be set equal to the deformation of the $Al_2O_3$ substrate in equation 3 and the stress P in the substrate can be solved for. Equation 7 is the solution for P of the combination of equation 3 and equation 6.

$$P = \frac{(\alpha_s - \alpha_r)\Delta T}{\left(\frac{t_s L}{2A_r E_r} + \frac{1-v_s}{E_s}\right)}. \quad \text{Equation 7}$$

Substituting the numbers from the example gives $$P = \frac{(6 - 23.4) \times 10^{-6}(-200)}{\left(\frac{.002(.040)}{2(.0075)^2(70 \times 10^9)} + \frac{1-.3}{270 \times 10^9}\right)} = 272 \times 10^6 \text{ Pa}$$

Once the stress P has been determined the deformation in the Al$_2$O$_3$ substrate, with the ring attached, can be calculated using equation 3. The length used is the longest or worst case diagonal from the middle of the substrate to the corner of the substrate or 40/square root of 2 which equals 28.3 mm.

$$\delta_s = \frac{(-272 \times 10^6)(.0283)(1-.3)}{270 \times 10^9} + (6 \times 10^{-6})(-200)(.0283) = -5.39 \times 10^{-5} \text{ m}.$$

The change in length or deformation of the al$_2$o$_3$ substrate without the ring compressing the substrate is given by equation 8 and is $(6 \times 10^{-6})(-200)(0.0283) = -3.396 \times 10^{-5}$ m. The change in length in the PC board for the same change in temperature, assuming no resisting force, is given by equation 8 and is $(17.6 \times 10^{-6})(-200)(0.0283) = -9.9616 \times 10^{-5}$ m.

$$\delta = \alpha \Delta T L \quad \text{Equation 8.}$$

Assuming the 0.9 mm solder balls take the differential expansion between the PC board and the al$_2$o$_3$ substrate in shear, the shear in the solder balls would be given by equation 9.

$$\gamma = \frac{\delta_{pc} - \delta_s}{.0009}. \quad \text{Equation 9}$$

Using equation 9 the shear in the solder balls from the substrate without the annular ring is $$\frac{(-9.9616 \times 10^{-5} + 3.396 \times 10^{-5})}{.0009} = -0.73$$

and the shear in the solder balls with the annular ring is $$\frac{(-9.9616 \times 10^{-5} + 5.39 \times 10^{-5})}{.0009} = -.0508.$$

The expected increase in solder ball fatigue life is given by equation 10.

$$\frac{N_{ring}}{N_{no-ring}} \approx \left(\frac{\gamma_{no-ring}}{\gamma_{ring}}\right)^2. \quad \text{Equation 10}$$

Where N is the number of cycles of temperature change until failure. Substituting the shear strain of the solder balls, with the ring and without the ring, into equation 10 gives $$\frac{N_{ring}}{N_{no-ring}} \approx \left(\frac{.073}{.0508}\right)^2 = 2.06$$

or the life, $N_{ring}$, with the ring is 2.06 larger than the life, $N_{no-ring}$, without the ring.

To make sure that the ring and the substrate have margin in how much stress they are undergoing from the differential thermal expansion, the stress, strain and margins will be calculated. The modulus of elasticity for the Al$_2$O$_3$ substrate is $270 \times 10^9$ Pa and the ultimate strength of the Al$_2$O$_3$ substrate is $270 \times 10^6$ Pa. The maximum allowable strain in the substrate is $$\epsilon = \frac{\sigma}{E},$$

substituting the values gives $270 \times 10^6 / 270 \times 10^9 = 0.001$. The factor of safety is the maximum allowable stress or strain in a material divided by the actual stress or strain in the material or the strength of the material divided by the stress in the material. The factor of safety for the Al$_2$O$_3$ substrate is given by equation 11.

$$FS = ABS\left(\frac{\epsilon_{max}}{\epsilon_{actual}}\right) = ABS\left(\frac{\epsilon_{max}}{\frac{-P}{E_s}(1-v_s)}\right). \quad \text{Equation 11}$$

Substituting the numbers from the example gives a factor of safety for the Al$_2$O$_3$ $$\text{substrate of } ABS\left(\frac{.001}{\frac{-272 \times 10^6}{270 \times 10^9}(1-.3)}\right) = 1.41.$$

The stress in the ring segment is given by equation 12.

$$\sigma = \frac{F}{A} = \frac{P t_s L}{2 t_r^2}. \quad \text{Equation 12}$$

Where F is the force, A is the area of a ring segment, P is the stress in the substrate, $t_s$ is the thickness of the substrate, L is the length of the substrate, and $t_r$ is the thickness of the ring segment. Substituting the numbers from the example into equation 11 gives the stress in a ring segment as $$\sigma = \frac{(272 \times 10^6)(.002)(.040)}{2(.0075)^2} = 193 \times 10^6 \text{ Pa}.$$

The ultimate strength of the aluminum ring is $483 \times 10^6$ Pa which gives a factor of safety of $483/193 = 2.5$. The factors of safety of 1.41 and 2.5 show that the strain in the Al$_2$O$_3$ substrate and the stress in the aluminum ring are well within reasonable limits.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for mounting an integrated circuit (IC) to a PC board, comprising:
   heating the IC and the PC board to an elevated temperature;
   joining the IC and PC board to form an IC/PC board assembly at the elevated temperature;
   cooling the IC/PC board assembly to a second temperature; and
   compressing the IC so that the IC contracts substantially proportionally to the PC board during said cooling thereby reducing the interfacial stress caused by differential thermal expansion in the IC/PC board assembly.

2. A method for mounting a substrate to a PC board, comprising:
   heating the substrate and the PC board to an elevated temperature;
   joining the substrate and PC board to form a substrate/PC board assembly at the elevated temperature;
   cooling the substrate/PC board assembly to a second temperature; and
   compressing the substrate so that the substrate contracts substantially proportionally to the PC board during said cooling thereby reducing the interfacial stress caused by differential thermal expansion in the substrate/PC board assembly.

3. Apparatus, comprising:
   an integrated circuit; and
   an annular part surrounding said integrated circuit, said annular part having a higher coefficient of thermal expansion than said integrated circuit, said annular part compressing said integrated circuit when said annular part and said integrated circuit are at an operating temperature.

4. The apparatus of claim 3, further comprising a PC board, said integrated circuit being attached to said PC board.

5. The apparatus of claim 3, further comprising a fill material positioned between said annular part and said integrated circuit.

6. The apparatus of claim 5, wherein said fill material comprises an epoxy.

7. Apparatus, comprising:
   a substrate; and
   an annular part surrounding said substrate, said annular part having a higher coefficient of thermal expansion than said substrate, said annular part compressing said substrate when said annular part and said substrate are at an operating temperature.

8. The apparatus of claim 7, further comprising a PC board, said substrate being attached to said PC board.

9. The apparatus of claim 8, further comprising an integrated circuit attached to said substrate.

10. The apparatus of claim 7, further comprising an integrated circuit attached to said substrate.

11. The apparatus of claim 7, further comprising a fill material positioned between said annular part and said substrate.

12. The apparatus of claim 11, wherein said fill material comprises an epoxy.

13. A method for increasing the tolerance of an IC/PC board assembly to interfacial stress caused by differential thermal expansion, comprising:
   heating an annular part to a first temperature, said annular part having a higher coefficient of thermal expansion than an integrated circuit of the IC/PC board assembly;
   positioning said annular part so that said annular part surrounds said integrated circuit when said annular part is at said first temperature; and
   cooling said annular part to a second temperature, said annular part compressing said integrated circuit during said cooling.

14. The method of claim 13, wherein positioning said annular part so that said annular part surrounds said integrated circuit occurs while said integrated circuit is being attached to a printed circuit board of the IC/PC board assembly.

15. The method of claim 13, wherein positioning said annular part so that said annular part surrounds said integrated circuit occurs before said integrated circuit is attached to a printed circuit board of the IC/PC board assembly.

16. The method of claim 13, further comprising, positioning a fill material between said annular part and said integrated circuit.

17. The method of claim 16, wherein said fill material is an epoxy.

18. A method for increasing the tolerance of an IC package/PC board assembly to interfacial stress caused by differential thermal expansion, comprising:
   heating an annular part to a first temperature, said annular part having a higher coefficient of thermal expansion than a substrate of the IC package/PC board assembly;
   positioning said annular part so that said annular part surrounds said substrate when said annular part is at said first temperature; and
   cooling said annular part to a second temperature, said annular part compressing said substrate during said cooling.

19. The method of claim 18, wherein positioning said annular part so that said annular part surrounds said substrate occurs while said substrate is being attached to a printed circuit board of the IC package/PC board assembly.

20. The method of claim 18, wherein positioning said annular part so that said annular part surrounds said substrate occurs before said substrate is attached to a printed circuit board of the IC package/PC board assembly.

21. The method of claim 18, further comprising, positioning a fill material between said annular part and said substrate.

22. The method of claim 21, wherein said fill material is an epoxy.

23. An IC/PC board assembly prepared by a process comprising the steps of:
   heating an annular part to a first temperature;
   positioning said annular part so that said annular part surrounds an integrated circuit when said annular part is at a first temperature, said annular part having a higher coefficient of thermal expansion than said integrated circuit;
   attaching said integrated circuit to a printed circuit board; and
   cooling said annular part to a second temperature, said annular part compressing said integrated circuit during said cooling.

24. An IC Package/PC board assembly prepared by a process comprising the steps of:

heating an annular part to a first temperature;

positioning said annular part so that said annular part surrounds a substrate when said annular part is at a first temperature, said annular part having a higher coefficient of thermal expansion than said substrate;

attaching an integrated circuit to said substrate;

attaching said substrate to a printed circuit board; and cooling said annular part to a second temperature, said annular part compressing said substrate during said cooling.

* * * * *